United States Patent [19]

Jaggard et al.

[11] Patent Number: 5,063,391

[45] Date of Patent: Nov. 5, 1991

[54] METHOD OF MEASURING CHIRAL PARAMETERS OF A CHIRAL MATERIAL

[75] Inventors: Dwight L. Jaggard, Newtown Square; Nader Engheta, King of Prussia, both of Pa.

[73] Assignee: The Trustees of the University of Penn., Pa.

[21] Appl. No.: 362,072

[22] Filed: Jun. 6, 1989

[51] Int. Cl.$^5$ .............................................. G01R 29/80
[52] U.S. Cl. ..................................... 343/703; 324/631
[58] Field of Search .................. 343/700 MS, 72, 756, 343/795, 829, 842, 846, 909, 703, 631, 639

[56] References Cited

U.S. PATENT DOCUMENTS

| | | | |
|---|---|---|---|
| 3,951,904 | 4/1976 | Tomonaga | 260/40 R |
| 3,972,049 | 7/1976 | Kaloi | 343/829 |
| 4,307,404 | 12/1981 | Young | 343/909 |
| 4,452,727 | 6/1984 | Frommer et al. | 252/518 |
| 4,456,548 | 6/1984 | Lewis et al. | 252/500 |
| 4,616,067 | 10/1986 | Lee et al. | 525/192 |
| 4,678,616 | 7/1987 | Tzeng | 428/551 |
| 4,701,765 | 10/1987 | Arduini | 343/909 |
| 4,809,011 | 2/1989 | Kunz | 343/909 |
| 4,948,922 | 8/1990 | Varadan et al. | 174/356 C |

FOREIGN PATENT DOCUMENTS 1400071   7/1975   United Kingdom ................ 343/909

OTHER PUBLICATIONS

Arnaud, J. A. et al., Resonant-Grid Quasioptical Diplexer, Electronic Letters, vol. 9, No. 25, Dec. 1973.
R. B. Kaner et al., "Plastics That Conduct Electricity," *Scientific American* (Feb. 1988).
A. Lakhtakia et al., "Scattering and Absorption Characteristics of Lossy Dielectric, Chiral, Non-Spherical Objects," *Applied Optics*, vol. 24, No. 23 (Dec. 1, 1985).
A. Lakhtakia et al., "A Parametric Study of Microwave Reflection Characteristics of a Planar Achiral-Chiral Interface," *IEEE Transactions on Electromagnetic Compatibility*, vol. EMC-28, No. 2 (May 1986).
Varadan et al., "On the Possibility of Designing Antireflection Coatings Using Chiral Composites," *Journal of Wave Material Interaction*, vol. 2, No. 1 (Jan. 1987), pp. 71-81.
Chirosourb TM As an Invisible Medium, Jaggard et al., *Electronics Letters*, vol. 25, No. 3, pp. 173-174, 2/2/89.
D. L. Jaggard et al., *Applied Physics*, 18, 1979, pp. 211-215.
S. Bassiri et al., *Alta Frequenza*, 2, 1986, pp. 83-88.
N. Engheta et al., *IEEE Trans. on Ant. & Propag.*, 37, 4, 1989, pp. 512-515.
S. Bassiri et al., *J. Opt. Soc. Am.* A5, 1988, pp. 1450-1459.
N. Engheta and P. Pelet, "Modes in Chirowaveguides," *Optics Letters*, vol. 14, No. 11 (Jun. 1, 1989).

*Primary Examiner*—Michael C. Wimer
*Assistant Examiner*—Peter Toby Brown

[57] ABSTRACT

Methods of measuring chiral parameters of chiral materials with chiral antennas are provided. These methods involve the use of parallel electric and magnetic dipoles to construct a point sensor in conjunction with the use of a turnstyle antenna as a source. By exciting the chiral medium with the turnstyle antenna, both the absolute degree of chirality and the handedness of the chiral medium can be measured by varying the output currents of the point sensor until a null is achieved. This condition indictes that the ratio p/m, where p is the magnitude of the electric dipole moment and m is the magnitude of the magnetic dipole moment, of the point sensor is $\pm i/v_c$. From this relation and knowledge of the relation of permittivity and permeability, the absolute value of the chiral admittance and the chirality factor of the medium can also be found.

6 Claims, 2 Drawing Sheets

METHOD OF MEASURING CHIRAL PARAMETERS OF A CHIRAL MATERIAL

FIELD OF INVENTION

Generally this invention relates generally to antennas. More specifically this invention relates to antennas comprising chiral materials.

BACKGROUND OF THE INVENTION

For time-harmonic electromagnetic waves with exp $(-i\omega t)$ excitation, chirality is introduced into electromagnetic theory through the constitutive relations given by $$D = \epsilon E + i\xi_c B \quad (1)$$

$$H = B/\mu + i\xi_c E \quad (2)$$

for the lossless case where boldface quantities denote vectors and plain text denotes scalars. The "chirality admittance" $\xi_c$ (a real number) is an indication of the degree of chirality of the medium and $\epsilon$ and $\mu$ (real numbers) are the usual permittivity and permeability, respectively. For lossy chiral media, the quantities $\epsilon$, $\mu$ and $\xi_c$ become complex numbers.

A "chiral medium" comprises chiral objects of the same handedness, randomly oriented and uniformly distributed in a host or background material. This host or background material may comprise common dielectric and/or magnetic materials wherein the chiral objects are embedded. A chiral object is a three-dimensional body that cannot be brought into congruence with its mirror image by translation and rotation. Therefore, all chiral objects can be classified in terms of their "handedness." The term "handedness," as known by those with skill in the art, refers to whether a chiral object is "right-handed" or "left-handed." That is, if a chiral object is right-handed (left-handed), its mirror image is left-handed (right-handed). Therefore, the mirror image of a chiral object is its enantiomorph and is said to be of opposite handedness.

Chiral media exhibit electromagnetic chirality which embraces optical activity and circular dichroism. Optical activity refers to the rotation of the plane of polarization of optical waves by a medium while circular dichroism indicates a change in the polarization ellipticity of optical waves by a medium. (There exists a variety of materials that exhibit optical activity. For example, for 0.63-mm wavelength, $TeO_2$ exhibits optical activity with a chirality admittance magnitude of $3.83 \times 10^{-7}$ mho. This results in a rotation of the plane of polarization of 87° per mm. Similar phenomena exist at microwave and millimeter wave frequencies when chiral objects of like handedness are embedded in a background or host medium.) These phenomena, known since the mid nineteenth century, are due to the presence of the two unequal characteristic wavenumbers corresponding to two circularly polarized eigenmodes with opposite handedness. The fundamentals of electromagnetic chirality are known. See, e.g., J. A. Kong, *Theory of Electromagnetic Waves*, pages 2–8, 77–79 (1975); E. J. Post, *Formal Structure of Electromagnetics*, pages 127–137, 171–176 (1962). More recent work includes the macroscopic treatment of electromagnetic waves with chiral structures, D. L. Jaggard et al., *Applied Physics* "On Electromagnetic Waves in Chiral Media," 18, 211–216, (1979); the analysis of dyadic Green's functions and dipole radiation in chiral media, S. Bassiri et al., *Alta Frequenza* "Dyadic Green's Function and Dipole Radiation in Chiral Media," 2, 83–88, (1986) and N. Engheta et al., *IEEE Trans. on Ant. & Propag.* "One- and Two-Dimensional Dyadic Green's Functions in Chiral Media," 37, 4, (1989); and the reflection and refraction of waves at a dielectric-chiral interface, S. Bassiri et al., *J. Opt. Soc. Am. A*5, "Electromagnetic Wave Propagation Through a Dielectric-Chiral Interface and Through a Chiral Slab," 1450–1459, (1988).

Using the time-harmonic Maxwell equations for both electric sources $J$ and $\rho$ and magnetic sources $J_m$ and $\rho_m$ yields $$\nabla \times E = i\omega B - J_m \quad (3)$$

$$\nabla \times H = J - i\omega D \quad (4)$$

$$\nabla \cdot B = \rho_m \quad (5)$$

$$\nabla \cdot D = \rho. \quad (6)$$

From these relations, the following inhomogeneous differential equations for the field quantities can be found with the aid of (1) and (2).

$$\Box_c^2 E = i\omega\mu[J - i\xi_c J_m] - \nabla \times J_m \quad (7)$$

$$\Box_c^2 H = i\omega\mu[i\xi_c J + J_m/\eta_c^2] + \nabla \times J \quad (8)$$

$$\Box_c^2 B = \mu\{\nabla \times [J + i\xi_c J_m] + i\omega\epsilon J_m\} \quad (9)$$

$$\Box_c^2 D = \mu\{i\omega\epsilon J + \nabla \times [i\xi_c J - J_m/\eta_c^2]\} \quad (10)$$

where the chiral differential operator is defined by the relation $$\Box_c^2\{\ \} \equiv \nabla \times \nabla \times \{\ \} - 2\omega\mu\xi_c \nabla \times \{\ \} - k^2\{\ \} \quad (11)$$

and where $$\eta_c \equiv \eta_o \left[ \frac{1}{\sqrt{1 + \eta_o^2 \xi_c^2}} \right] \quad (12)$$

is a generalized "chiral impedance" with $\eta_o (= \sqrt{\mu/\epsilon})$ as the background intrinsic wave impedance. The introduction of both the chiral impedance by relation (12) and the chiral admittance through expressions (1)–(2) leads to the definition of a dimensionless "chirality factor" $\kappa$ given by the product:

$$\kappa \equiv \eta_c \xi_c, \quad (13)$$

where the absolute value of $\kappa$ is bounded by zero and unity. This parameter is a quantitative measure of the degree of chirality of the medium.

Since the fields $E$, $B$, $D$ and $H$ are linearly dependent on the current sources $J$ and $J_m$ one can write these fields in terms of integrals over the sources and an appropriately defined dyadic Green's function. Furthermore, these expressions can be simplified so that each field eigenmode, denoted by a "$\pm$" subscript is written in the form below:

$$E(x)_\pm = i\omega\mu \int \underline{\Gamma}^\pm(x,x') \cdot [J(x') \pm iJ_m(x')/\eta_c]dx' \quad (14)$$

$$H(x)_\pm = \frac{-i\omega\mu}{\eta_c} \int \underline{\Gamma}^\pm(x,x') \cdot (\pm i)[J(x') \pm iJ_m(x')/\eta_c]dx' \quad (15)$$

-continued $$B(x)_\pm = -i\mu k_\pm \int \underline{\Gamma}^\pm(x,x') \cdot (\pm i)[J(x') \pm iJ_m(x')/\eta_c]dx' \quad (16)$$

$$D(x)_\pm = \frac{i\mu k_\pm}{\eta_c} \int \underline{\Gamma}^\pm(x,x') \cdot [J(x') \pm iJ_m(x')/\eta_c]dx' \quad (17)$$

where the dyadic Green's function $\underline{\Gamma}(x,x')$ is given below and x is the observation vector (x,y,z) and x' is the source vector (x',y',z'). Here boldface quantities denote vectors while underbars indicate dyads. It is noted that the total field quantities are the sum of the "+" and the "−" eigenmodes given in (14)–(17). Each eigenmode represents a circularly polarized wave of a given handedness.

The dyadic Green's function $\underline{\Gamma}(x,x')$ can be rewritten in the compact form $$\underline{\Gamma}(x,x') = \underline{\Gamma}^+(x,x') + \underline{\Gamma}^-(x,x') = \beta\underline{\gamma}^+ \\ (k_+)G_+(x,x') + [1-\beta]\underline{\gamma}^-(k_-)G_-(x,x') \quad (18)$$

where the "+" and "−" superscripts refer to the first and second terms, respectively, on the right-hand side of (18) and the dyadic operators for the two eigenmodes are given in terms of the unit dyad $\underline{I}$ by $$\underline{\gamma}^\pm(k_\pm) = \{\underline{I} \pm k_\pm^{-1}\underline{I} \times \nabla + k_\pm^{-2}\nabla\nabla\} \quad (19)$$

and where $$G_\pm(x,x') = \frac{\exp[ik_\pm|x-x'|]}{4\pi|x-x'|} \quad (20)$$

$$k_\pm = k_o[\sqrt{1 + \eta_o^2\xi_c^2} \pm \eta_o\xi_c] = k_o\sqrt{1 + \eta_o^2\xi_c^2}\,[1 \pm \kappa] \quad (21)$$

$$\beta = \frac{k_o^2 - k_+^2}{k_-^2 - k_+^2} = \frac{1}{2}[1 + \kappa] \quad (22)$$

$$1 - \beta = \frac{k_o^2 - k_-^2}{k_+^2 - k_-^2} = \frac{1}{2}[1 - \kappa]. \quad (23)$$

The wavenumbers $k_\pm$ are the propagation constants for the two eigenmodes ("+" and "−") supported by the medium. The factors $\beta$ and $1-\beta$ are denoted "handedness factors". These quantities will play a role in the far-field radiation patterns of antennas and arrays and represent the relative amplitude of waves of each handedness. Here $k_o(=\omega\sqrt{\mu\epsilon})$ is the host or background wavenumber of the achiral (meaning not chiral) media with identical permittivity and permeability.

From a far-field expansion of the Green's dyad (18) the electric field eigenmodes corresponding to (14) can be written in the form $$E(x)_\pm \underset{kr \gg 1}{\rightarrow} i\omega\mu \begin{pmatrix} \beta \\ 1-\beta \end{pmatrix} \frac{e^{ik_\pm r}}{4\pi r} [-\hat{e}_r \times \hat{e}_r \times \pm i\hat{e}_r \times] \quad (24)$$

$$\int e^{-ik_\pm \hat{e}_r \cdot x'}[J(x') \pm iJ_m(x')/\eta_c]dx'$$

for general current sources where $r=|x|$, $\hat{e}_r$ is a unit vector along the observation position vector x. It is understood here and in the following equations that in the triple cross product involving $\hat{e}_r$ the cross products are carried out right to left. Likewise, using (15) it can be shown that the magnetic field in this limit is given by the relation $$H(x)_\pm \underset{kr \gg 1}{\rightarrow} \frac{i\omega\mu}{\eta_c} \begin{pmatrix} \beta \\ 1-\beta \end{pmatrix} \frac{e^{ik_\pm r}}{4\pi r} [\hat{e}_r \times \pm i\hat{e}_r \times \hat{e}_r \times] \quad (25)$$

$$\int e^{-ik_\pm \hat{e}_r \cdot x'}[J(x') \pm iJ_m(x')/\eta_c]dx'$$

Of particular note from (24)–(25) is that either eigenmode can be excited while the other is suppressed through the appropriate choice of electric and magnetic sources.

SUMMARY OF THE INVENTION

Antennas comprising at least one antenna element, and chiral material in proximity to the antenna element wherein two electromagnetic modes are allowed, are provided in accordance with this invention.

DETAILED DESCRIPTION OF PREFERRED EMBODIMENTS

The inventors of the subject matter disclosed and claimed herein have achieved novel results in the theoretical investigation of antenna arrays comprising chiral materials. The terms "chiroarray", "array," "chiral antenna" and "antenna array" are used interchangeably throughout the present disclosure to denote such structures provided in accordance with the present invention wherein antennas are embedded in chiral media. The antenna elements immersed in chiral media in accordance with this invention may be any standard antenna elements such as, inter alia, electric dipoles, radiating loops, point sources, horn antennas, aperture antennas, waveguide radiators, dielectric elements and the like. As known by those with skill in the art, an "antenna array" is a structure suitable for the transmission, reception or sensing of electromagnetic energy and may comprise dipoles, loops, horns, wires and other radiating elements. Chiroarrays have a variety of potential applications in microwave, millimeter wave and optical systems and devices used for transmission, reception and sensing.

Figure 1:
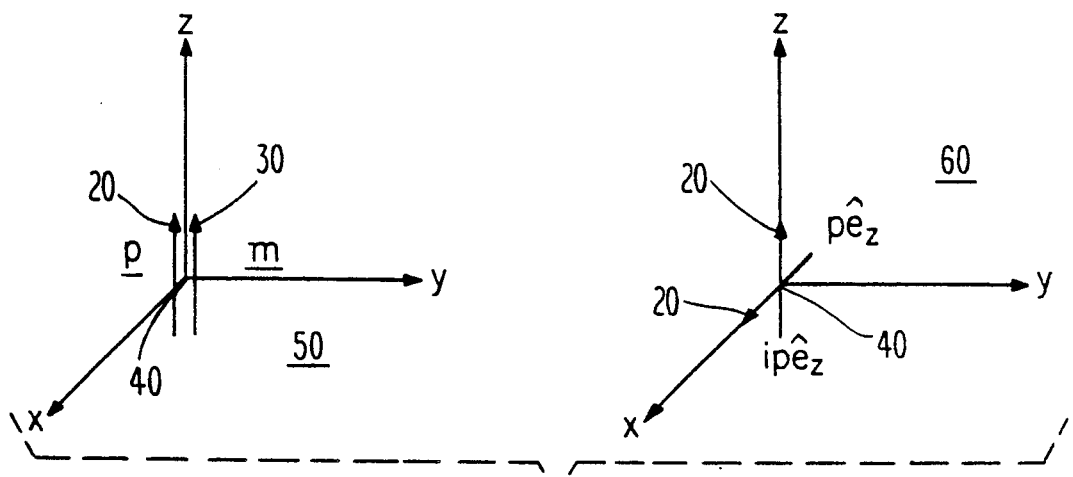
FIG. 1 is an illustration of two two-element point arrays provided in accordance with this invention.

Referring now to the drawings wherein like reference numbers refer to like elements, FIG. 1 represents point arrays, comprising both electric dipoles 20 and magnetic dipoles 30. In the far zone, i.e., many wavelengths away from the dipole or $kr \gg 1$, the expression for the electric field eigenmodes due to a point electric dipole p and point electric magnetic dipole m located at the origin 40 is found from (24) with the relations $J(x') = -i\omega p\delta(x')$ and $J_m(x') = -i\omega\mu m\delta(x')$ as $$E(x)_\pm \underset{kr \gg 1}{\rightarrow} \omega^2\mu \begin{pmatrix} \beta \\ 1-\beta \end{pmatrix}\{-\hat{e}_r \times \hat{e}_r \times \quad (26)$$

$$[p \pm im/v_c] \pm i\hat{e}_r \times [p \pm im/v_c]\}\frac{e^{ik_\pm r}}{4\pi r}$$

-continued with $v_c \equiv \eta_c/\mu \equiv [\sqrt{\mu\epsilon} \sqrt{1 + \eta_0^2 \xi_c^2}]^{-1}$ being the generalized "chiral velocity". This expression suggests ways in which one or both of the eigenmodes of the medium can be excited or sensed. The two-element point array 50, in preferred embodiments, is formed by coincident parallel electric and magnetic dipoles 20 and 30. The turnstyle antenna 60 is formed, in preferred embodiments, by the two coincident orthogonal electric dipoles 20.

Consider the case of the parallel electric dipole 20 and the magnetic dipole 30 in antenna array 50 located at the origin 40, preferably in a spherical coordinate system $(r,\theta,\phi)$. Assume as the first special case the relation where the currents in the two dipoles are in phase and give rise to fields of equal magnitude. If $p = im/v_c = p\hat{e}_z$, only the positive eigenmode is excited and the total electric field is found to be $$E(x) = E(x)_+ \underset{kr \gg 1}{\longrightarrow} -2\sqrt{2}\,\omega^2\mu\,\beta\,p\,\sin\theta\,\frac{e^{ik_+r}}{4\pi r}\,\hat{e}_+ \quad (27)$$

while if $p = -im/v_c = p\hat{e}_z$, only the negative eigenmode is excited and the result is $$E(x) = E(x)_- \underset{kr \gg 1}{\longrightarrow} -2\sqrt{2}\,\omega^2\mu(1-\beta)p\,\sin\theta\,\frac{e^{ik_-r}}{4\pi r}\,\hat{e}_- \quad (28)$$

for the total electric field where the circular polarization basis vectors are $\hat{e}_\pm = (\hat{e}_\theta \pm i\hat{e}_\phi)/\sqrt{2}$ and the angles $\theta$ and $\phi$ are the polar and azimuthal angles measured from the z and x axes, respectively. The sole excitation of a single eigenmode of the chiral medium is particular to the case where both electric and magnetic sources are present since this cannot be accomplished in chiral medium with only electric sources. Further, the far field is perfectly circularly polarized, regardless of direction. As in the achiral case, however, the radiation pattern has the $\sin\theta$ dependance characteristic of all electrically small sources.

As the second special case, consider the case where the currents in the two dipoles are fed out of phase so that the moments are in phase and are given by $p = m/v_c = p\hat{e}_z$. The far-zone electric field calculation using (26) yields an expression for both eigenmodes as:

$$E(x)_\pm \underset{kr \gg 1}{\longrightarrow} -\sqrt{2}\,\omega^2\mu \left(\begin{matrix}\beta \\ 1-\beta\end{matrix}\right) p(1 \pm i)\sin\theta\,\frac{e^{ik_\pm r}}{4\pi r}\,\hat{e}_\pm \quad (29)$$

in a manner similar to that of the electric dipole alone. Here the total electric field is not circularly polarized but instead is elliptically polarized.

Figure 2:
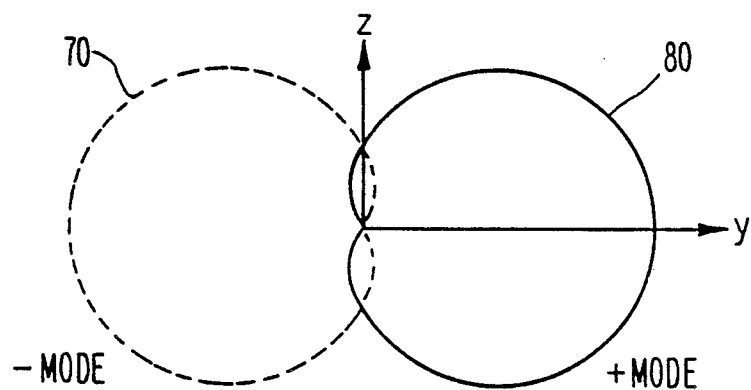
FIG. 2 is the radiation pattern of the turnstyle antenna of FIG. 1.

As the third case, consider the turnstyle antenna 60 where the electric current distribution is given by $J(x') = -i\omega p(\hat{e}_z + i\hat{e}_x)\delta(x')$. Using (26) the far-zone electric field exhibits the two circularly polarized eigenmodes as given by:

$$E(x)_\pm \underset{kr \gg 1}{\longrightarrow} -\sqrt{2}\,\omega^2\mu \left(\begin{matrix}\beta \\ 1-\beta\end{matrix}\right) p\,\frac{e^{ik_\pm r}}{4\pi\rho} [1 \pm \sin\theta\sin\phi]\,\hat{e}_\pm' \quad (30)$$

where $\hat{e}_\pm'$ denotes the right- and left-handed circular polarization vectors with rotated axes. These two eigenmodes possess considerably different angular dependences. Referring to FIG. 2, the two eigenmodes 70 and 80 of Eqn. (30) access two different half spaces divided by the plane of the turnstyle antennas 60. Therefore, in this case, each half space has essentially a circularly polarized wave of opposite handedness.

Figure 3:
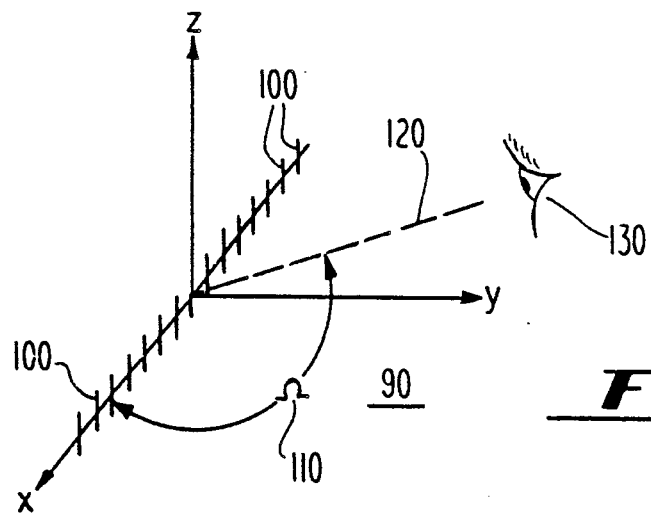
FIG. 3 is a linear array of N-element dipoles spaced a distance d apart along the x axis.

Referring to FIG. 3, a distributed source or antenna array 90 is comprised of a linear array of N dipoles or other radiating elements 100 embedded in chiral media spaced a distance d apart along the x axis. Since there is an inherent geometrical spacing which defines the array 90, the two eigenmodes of the medium will "see" an array of differing effective geometry i.e., spacing and total length. The phase shift per element (in free space) is taken to be $\alpha$. Equation (24) produce the eigenmode expressions for the far-zone electric field as:

$$E(x)_\pm \underset{kr \gg 1}{\longrightarrow} = \omega^2\mu\underline{\Gamma}^\pm(x,0) \cdot [p \pm im/v_c]\,AF_\pm \quad (31)$$

where the angular dependance of the array factor $AF_\pm$ is given by $$AF_\pm = \frac{\sin\left[\frac{N}{2}(k_\pm d \cos\Omega + \alpha)\right]}{\sin\left[\frac{1}{2}(k_\pm d \cos\Omega + \alpha)\right]} \quad (32)$$

and where $\Omega$ 110 is the angle between the array axis (x axis in this exemplary case) and the position vector 120 of the observer 130. Here both eigenmodes play an important role except for the special case of $\pm p = im/v_c$ when only one of the eigenmodes is excited as noted above.

Consider the case when dipoles 100 are strictly electric dipoles given by $p = p\hat{e}_z$. The total electric field in the far-zone is found to be:

$$E(x) \underset{kr \gg 1}{\longrightarrow} -\sqrt{2}\,\omega^2\mu\,p\,\sin\theta \left\{ [\beta]\frac{e^{ik_+r}}{4\pi r} AF_+ \hat{e}_+ + [1-\beta]\frac{e^{ik_-r}}{4\pi r} AF_+ \hat{e}_- \right\} \quad (33)$$

which defines an elliptically polarized wave (combined from the two circular eigenmodes) at broadside but, for nonzero phase shifts, can also exhibit two beams of opposite handedness.

Figure 4:
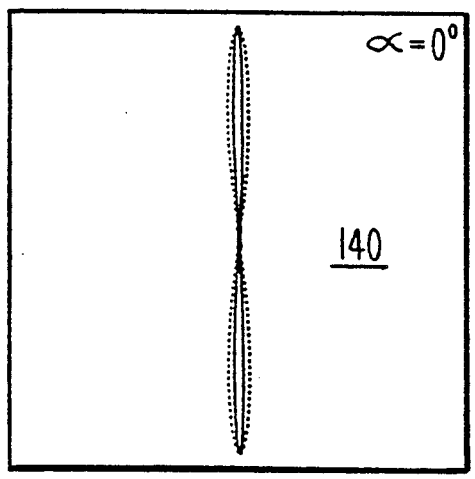
FIG. 4 is the radiation pattern of the linear array of FIG. 3 which illustrates beam splitting and mode suppression.
Figure 4:
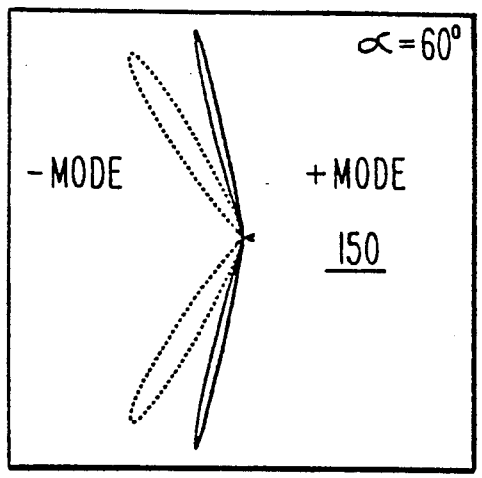
Figure 4:
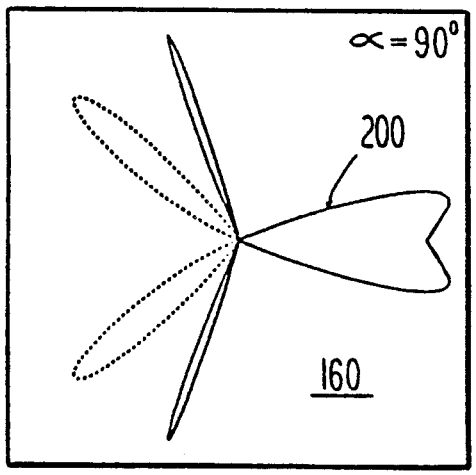
Figure 4:
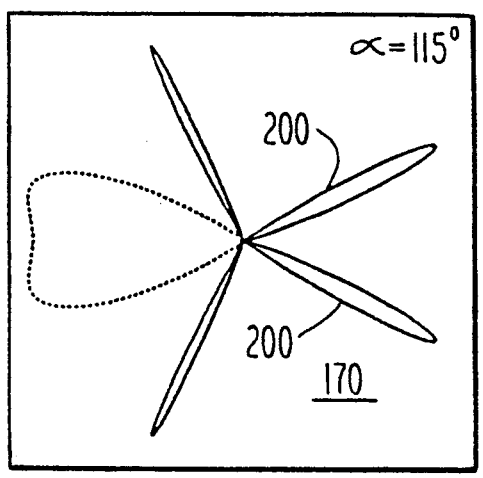
Figure 4:
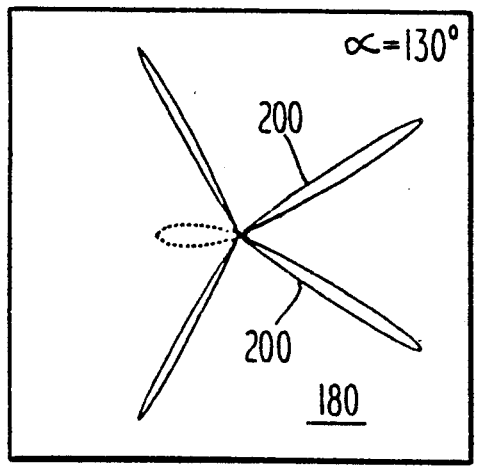
Figure 4:
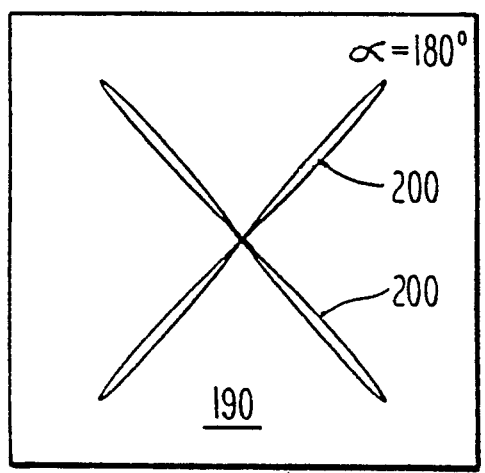

Referring to FIG. 4 the far zone radiation pattern of electric field (33) for an array for preferably N = 15 antenna elements, spaced a half-wavelength apart $(k_0 d = \pi)$ is shown. The phase shift $\alpha$ is varied from broadside ($\alpha = 0$) to increasing values to illustrate "beam splitting". Beam splitting occurs when the main lobes of the two eigenmodes have the same first null and are not overlapping. The criterion for beam splitting is:

$$N|\alpha| = 2\pi/\kappa. \qquad (34)$$

This indicates that for values of $N|\alpha|$ larger than those of (34), the array exhibits two distinct main beams, each circularly polarized with opposite handedness.

Degrees of beam separation for six exemplary values of phase shift $\alpha$ with positive chiral admittance $\xi_c$ are shown. The broadside case, $\alpha=0$ shown generally at 140 illustrates complete beam overlap when the elements are fed in phase. When the phase shift is increased to satisfy Eqn. (34), phase shift until condition (34) is met in part (b). As the phase shift is increased, $\alpha=60°$ shown generally at 150, beam splitting occurs. As the phase shift is further increased $\alpha=90°$, $\alpha=115°$, $\alpha=130°$, $\alpha=180°$, respectively 160, 170, 180 and 190 grating lobes 200 appear. In the limit as $\alpha \rightarrow 180°$, generally at 190, almost all of the beam energy in the negative eigenmode vanishes and is converted to the positive eigenmode. This is generally noted "beam suppression" and is of interest when it is desired to use the antenna array of FIG. 3 as a source of circular polarization.

The canonical cases discussed above are of practical interest in a variety of problems. In preferred embodiments, chiral antennas provided in accordance with this invention, may comprise chiral radomes. In further preferred embodiments, chiral antennas provided in accordance with this invention may comprise lenses of chiral material which focus electromagetic waves on conventional antennas, antenna arrays, waveguide antennas, horn antennas or dielectric antennas. The results given here for unbounded chiral media in preferred embodiments provide an upper bound or first-order approximation for the effect of finite non-resonant chiral slabs.

In yet further preferred embodiments of chiral antennas provided in accordance with this invention, chiral sensors for the characterization of chiral parameters, of a material may be constructed. Of particular interest is the problem of chirality measurement which involves either the specification of the chirality factor and sense of handedness or equivalently the specification of the chiral admittance. This has traditionally been accomplished in optics through a measurement of the rotation of the plane of polarization over a differential path. However, at lower frequencies such as in the microwave and millimeter wave regime, previous methods of measuring chiral parameters may be ineffective. A long-felt need in the art therefore exists for an efficient and accurate method for measuring the chiral parameters of a chiral material.

In accordance with the present invention methods of measuring chiral parameters of a chiral material with chiral antennas are provided. In preferred embodiments, these methods involve the use of the parallel electric and magnetic dipoles to construct a point sensor in conjunction with the use of the turnstyle antenna as a source. By exciting the chiral medium by a turnstyle antenna, both the absolute degree of chirality and the handedness of the chiral medium can be measured by varying the output currents of the point sensor until a null is achieved. This condition indicates that the ratio p/m (p is the magnitude of the electric dipole moment and m is the magnitude of the magnetic dipole moment) of the point sensor is $\pm i/v_c$. From this relation and knowledge of the background permittivity and permeability, the absolute value of the chiral admittance and the chirality factor of the medium can also be found. To find the sign of the chiral admittance or the sense of handedness of the medium, the turnstyle antenna can be used in two mirror-image orientations in which the plane of the antenna is perpendicular to the line connecting the transmitting turnstyle antenna to the point sensor. The larger signal will indicate the correct sense of handedness since the two eigenmodes of the turnstyle antenna access opposing half-spaces.

There have thus been described certain preferred embodiments of chiral antennas provided in accordance with this invention. While preferred embodiments have been disclosed and described, it will be recognized by those with skill in the art that modifications are within the true spirit and scope of the invention. The appended claims are intended to cover all such modifications.

What is claimed is:

1. A method of measuring chiral parameters of a chiral material, the steps of the method comprising:
   providing at least one antenna sensing element;
   irradiating the chiral material with electromagnetic energy from at least one transmitting antenna element thereby exciting the chiral material with the electromagnetic radiation and causing the electromagnetic energy to propagate in the chiral material according to two eigenmodes of propagation;
   sensing the electromagnetic energy propagating in the chiral material according to the two eigenmodes of propagation with the antenna sensing element; and
   determining the chiral parameters from the sensed electromagnetic energy propagating according to the two eigenmodes of propagation.

2. The method recited in claim 1 wherein the transmitting antenna element is a turnstile antenna.

3. The method recited in claim 2 wherein the antenna sensing element comprises at least one electric dipole having an electric dipole moment and at least one magnetic dipole having a magnetic dipole moment.

4. The method recited in claim 3 wherein the electric and magnetic dipoles are parallel.

5. The method recited in claim 4 wherein the electric and magnetic dipoles form a point sensor which outputs a current when excited by the electromagnetic energy.

6. The method recited in claim 5 further comprising the step of varying the output current of the point sensor to achieve a null to indicate a ratio of the electric dipole moment to the magnetic dipole moment.

* * * * *